United States Patent
Kim

(10) Patent No.: US 8,399,342 B2
(45) Date of Patent: Mar. 19, 2013

(54) METHOD FOR FABRICATING SEMICONDUCTOR DEVICE WITH BURIED BIT LINES

(75) Inventor: Tae-Kyun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/080,415

(22) Filed: Apr. 5, 2011

(65) Prior Publication Data

US 2012/0064704 A1 Mar. 15, 2012

(30) Foreign Application Priority Data

Sep. 10, 2010 (KR) .................. 10-2010-0088889

(51) Int. Cl.
*H01L 21/265* (2006.01)

(52) U.S. Cl. ........ 438/513; 438/525; 438/542; 438/685; 257/E21.158; 257/E21.331; 257/E21.334

(58) Field of Classification Search .............. 438/513, 438/525, 542, 685; 257/E21.158, E21.331, 257/E21.334
See application file for complete search history.

(56) References Cited

U.S. PATENT DOCUMENTS

| | | | |
|---|---|---|---|
| 6,191,459 B1 * | 2/2001 | Hofmann et al. ............. 257/390 |
| 6,451,651 B1 * | 9/2002 | Park et al. ..................... 438/253 |
| 7,642,590 B2 * | 1/2010 | Lee ................................ 257/303 |
| 2005/0020013 A1 * | 1/2005 | Moriya et al. ................ 438/262 |
| 2009/0004861 A1 * | 1/2009 | Lee et al. ...................... 438/692 |
| 2010/0003782 A1 * | 1/2010 | Sinha et al. ................... 438/104 |
| 2010/0009531 A1 * | 1/2010 | Choi et al. .................... 438/643 |
| 2010/0120221 A1 * | 5/2010 | Kang ............................. 438/430 |
| 2011/0073940 A1 * | 3/2011 | Lee et al. ...................... 257/332 |
| 2011/0284942 A1 * | 11/2011 | Dong et al. ................... 257/314 |
| 2011/0306192 A1 * | 12/2011 | Eun et al. ..................... 438/506 |

FOREIGN PATENT DOCUMENTS

| | | |
|---|---|---|
| KR | 1020060069008 | 6/2006 |
| KR | 1020090066488 | 6/2009 |
| KR | 1020090099774 | 9/2009 |
| KR | 1020110047836 | 5/2011 |

OTHER PUBLICATIONS

Notice of Preliminary Rejection issued from Korean Intellectual Property Office on Jul. 19, 2011.
Notice of Allowance issued by the Korean Intellectual Property Office on Mar. 2, 2012.

* cited by examiner

*Primary Examiner* — Alexander Ghyka
*Assistant Examiner* — Stanetta Isaac
(74) *Attorney, Agent, or Firm* — IP & T Group LLP

(57) ABSTRACT

A method for fabricating a semiconductor device includes forming a plurality of bodies isolated by trenches by etching a substrate, forming a buried bit line gap-filling a portion of each trench, forming an etch stop layer on an upper surface of the buried bit line; and forming a word line extended in a direction crossing the buried bit line over the etch stop layer.

20 Claims, 10 Drawing Sheets

METHOD FOR FABRICATING SEMICONDUCTOR DEVICE WITH BURIED BIT LINES

CROSS-REFERENCE TO RELATED APPLICATIONS

The present application claims priority of Korean Patent Application No. 10-2010-0088889, filed on Sep. 10, 2010, which is incorporated herein by reference in its entirety.

BACKGROUND OF THE INVENTION

Exemplary embodiments of the present invention relate to a method for fabricating a semiconductor device, and more particularly, to a method for fabricating a semiconductor device with buried bit lines.

High-integration Dynamic Random Access Memory (DRAM) devices manufactured using under 50 nm process are being developed. Accordingly, a cell structure of $8F^2$, where F denotes a minimum feature size, has been transitioning to a cell structure of $6F^2$ to increase a net die through the improvement in the integration degree. Moreover, a more highly integrated cell structure of $4F^2$ has been also being developed intensively. In the cell structure of $4F^2$, vertical gates (VG) are introduced. With the vertical gates, cells come to have vertical channel transistors. The vertical channel transistors are transistors where a vertical gate (or word line) is formed on the sidewalls of each pillar and thus a channel is formed in a vertical direction. Along with the introduction of the vertical channel transistors, buried bit lines (BBL) are formed to intensify the integration degree of cells. The buried bit lines are formed through an ion implantation of a dopant.

However, when the sizes of semiconductor devices shrink, decreasing the resistance of the buried bit lines by using an ion-implantation technique are reaching limits.

Here, since various processes are performed after the formation of buried bit lines, the surface of the buried bit lines may be damaged.

SUMMARY OF THE INVENTION

An exemplary embodiment of the present invention is directed to a method for fabricating a semiconductor device which is appropriate for a high-speed operation by decreasing the resistance of buried bit lines.

Another exemplary embodiment of the present invention is directed to a method for fabricating a semiconductor device that may protect buried bit lines from being damaged through subsequent processes.

In accordance with an exemplary embodiment of the present invention, a method for fabricating a semiconductor device includes: forming a plurality of bodies isolated by trenches by etching a substrate; forming a buried bit line gap-filling a portion of each trench; forming an etch stop layer on an upper surface of the buried bit line; and forming a word line extended in a direction crossing the buried bit line over the etch stop layer.

In accordance with another exemplary embodiment of the present invention, a method for fabricating a semiconductor device includes: forming a plurality of bodies isolated by trenches by etching a substrate; forming a buried bit line gap-filling a portion of each trench; forming an etch stop layer over the buried bit line; forming an inter-layer dielectric layer gap-filling the trench over the etch stop layer; forming a word line trench by etching the inter-layer dielectric layer over the etch stop layer and the bodies in a direction crossing the buried bit line; and forming a word line extended in a direction crossing the buried bit line on a sidewall of the word line trench.

DESCRIPTION OF SPECIFIC EMBODIMENTS

Figure 1A:
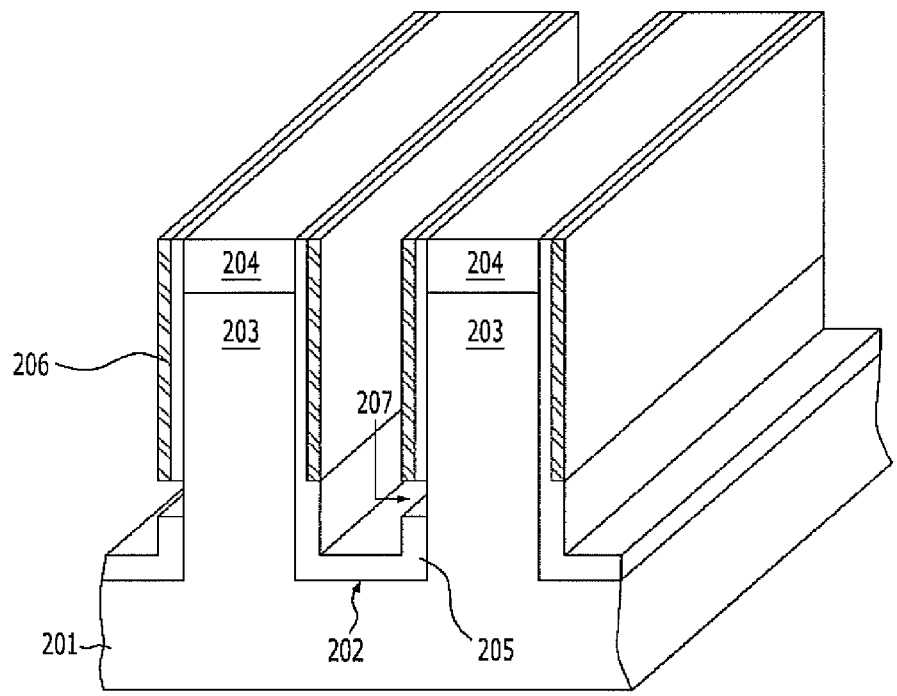
FIGS. 1A to 1H are perspective views illustrating a method for fabricating a semiconductor device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1H are perspective views illustrating a method for fabricating a semiconductor device in accordance with an exemplary embodiment of the present invention.

Referring to FIG. 1A, a plurality of bodies 203 isolated by a trench 202 from each other are formed over a substrate 201. The substrate 201 includes, for example, a silicon substrate. The trench 202 is formed by etching the substrate 201 in a predetermined depth. The trench 202 is formed between the bodies 203. Since the substrate 201 is made of, for example, a silicon substrate, the bodies 203 are made of silicon bodies. The plurality of the bodies 203 are formed in a vertical direction from the surface of the substrate 201. The plurality of the bodies 203 are used as active regions. An active region is an area and the channel of a transistor, a source, and a drain are formed therein. Each of the bodies 203 has a plurality of sidewalls and, for example, is a line-type body having at least two oppositely located, line-type sidewalls. The bodies 203 are also referred to as active bodies.

A hard mask layer 204 is formed in the upper portion of each body 203. The hard mask layer 204 functions as an etch barrier during the etching of the substrate 201 for forming the trench 202. The hard mask layer 204 may be a dielectric material layer, for example, an oxide layer or a nitride layer. In the embodiment, a nitride layer is used as the hard mask layer 204. The hard mask layer 204 includes, for example, a silicon nitride layer.

An insulation layer is formed on both sidewalls of each body 203, the surface of the trench 202 between the bodies 203, and the sidewalls of the hard mask layer 204. The insulation layer includes a liner oxide layer 205 and a liner nitride layer 206. The liner oxide layer 205 is formed on both sidewalls of each active region 203 and the surface of the substrate 201. The liner nitride layer 206 is formed on the surface of a portion of the liner oxide layer 205.

A side contact 207 is formed by removing a portion of the insulation layer. The side contact 207 has a one-side-contact (OSC) structure which selectively exposes a portion of any one sidewall of each body 203. The side contact 207 is a line-type contact. In other words, the side contact 207 opens a portion of a sidewall of each body 203 in a line shape along the direction that the body 203 is extended.

The above-described insulation layer provides the side contact 207 that exposes a portion of a sidewall of each body 203. The method for forming the side contact 207 will be described later on with reference to FIGS. 2A to 2K.

Figure 1B:
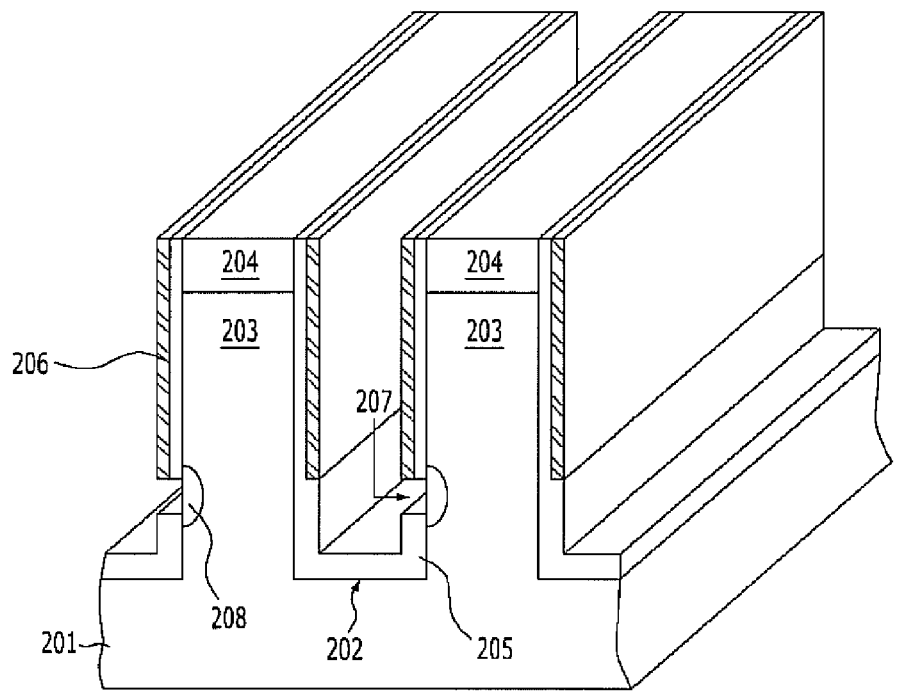

Referring to FIG. 1B, a junction 208 is formed on a portion of a sidewall of each body 203 exposed by the side contact 207. The junction 208 may be formed through, for example, a tilt ion implantation process, a plasma doping process, or a thermal diffusion process using a doped layer. The junction 208 has a doping concentration of more than, for example, at least $1 \times 10^{20}$ atoms/cm$^3$. The junction 208 is doped with, for example, phosphorus (P) or arsenic (As). Accordingly, the junction 208 becomes an N-type junction.

With the plasma doping method or the thermal diffusion process, the junction 208 may be controlled to have a shallow depth and/or the concentration of a dopant may be controlled. The junction 208 becomes a source or a drain of a vertical channel transistor.

Figure 1C:
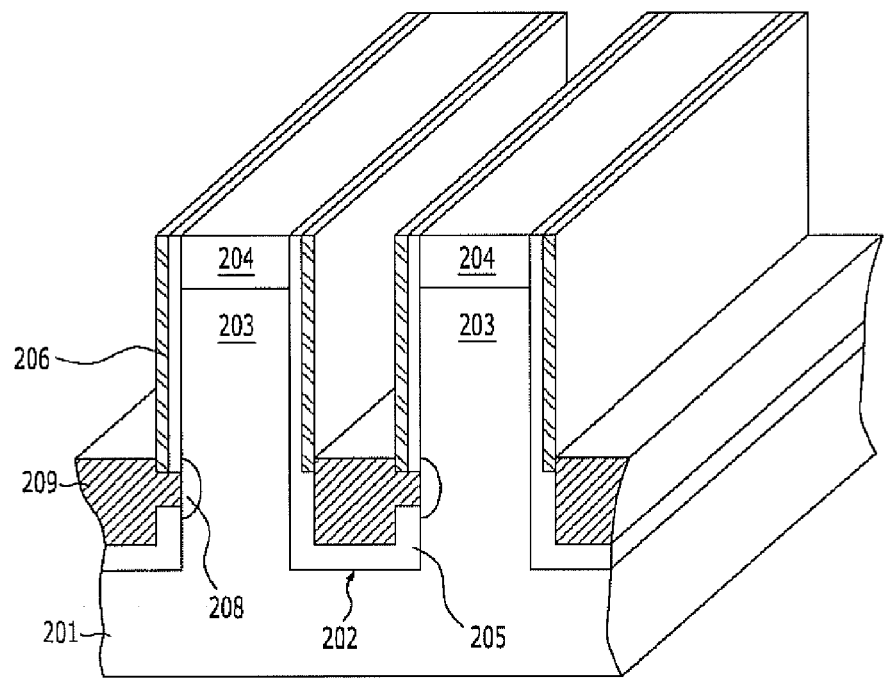

Referring to FIG. 1C, a buried bit line 209 coupled with the junction 208 and filling a portion of the trench 202 is formed. To form the buried bit line 209, a conductive layer is formed to gap-fill the trench 202 and then a planarization process is performed using a Chemical Mechanical Polishing (CMP) method. Subsequently, the conductive layer is etched back to the height contacting the junction 208. As a result, the buried bit line 209 coupled with the junction 208 is formed. Herein, the buried bit line 209 is formed of a metal layer such as titanium (Ti) layer, or a tungsten (W) layer. In the exemplary embodiment, the buried bit line 209 is formed of tungsten (W). Since the buried bit line 209 is formed of a metal layer, resistance thereof may be decreased and thus, a semiconductor device may be miniaturized without deteriorating device characteristics.

According to another embodiment, a barrier metal may be formed in advance before the formation of the buried bit line 209. The barrier metal may be formed by stacking, for example, a titanium (Ti) layer and a titanium nitride (TiN) layer.

Figure 1D:
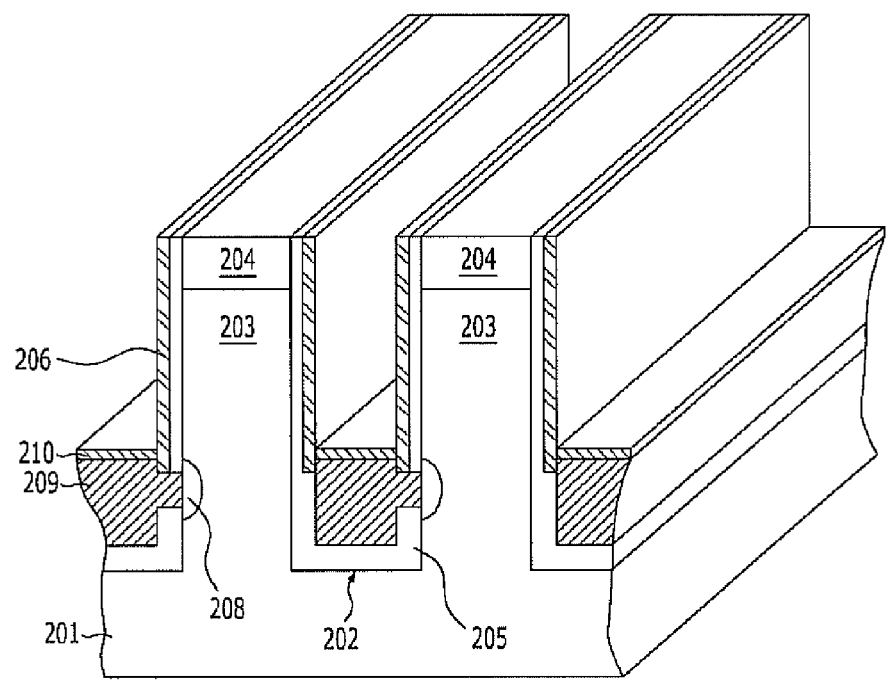

Referring to FIG. 1D, a surface treatment is performed onto the buried bit line 209. A surface treatment is performed onto the buried bit line 209. As a result, an etch stop layer 210 is formed on the surface of the buried bit line 209. The etch stop layer 210 includes, for example, an insulation layer for insulating the buried bit line 209 from a word line to be formed later. When the buried bit line 209 is formed as a metal layer, the etch stop layer 210 is formed as a metal oxide layer. When the buried bit line 209 is formed of tungsten, the etch stop layer 210 may be formed of a tungsten oxide (WO$_x$) layer. For example, the etch stop layer 210 may be formed of tungsten three nitride (WO$_3$).

The surface treatment for forming the etch stop layer 210 includes an oxide process.

The etch stop layer 210 is formed by oxidizing the surface of the buried bit line 209. For example, the etch stop layer 210 may be formed by performing a plasma oxidation process. When the buried bit line 209 is formed of tungsten, the etch stop layer 210 may be formed of a tungsten oxide layer through a plasma oxidation process. Herein, the tungsten oxide layer may be formed in a thickness ranging from approximately 100 Å to approximately 200 Å. The tungsten oxide layer functions as an etch stop layer during a subsequent etch process.

Figure 1E:
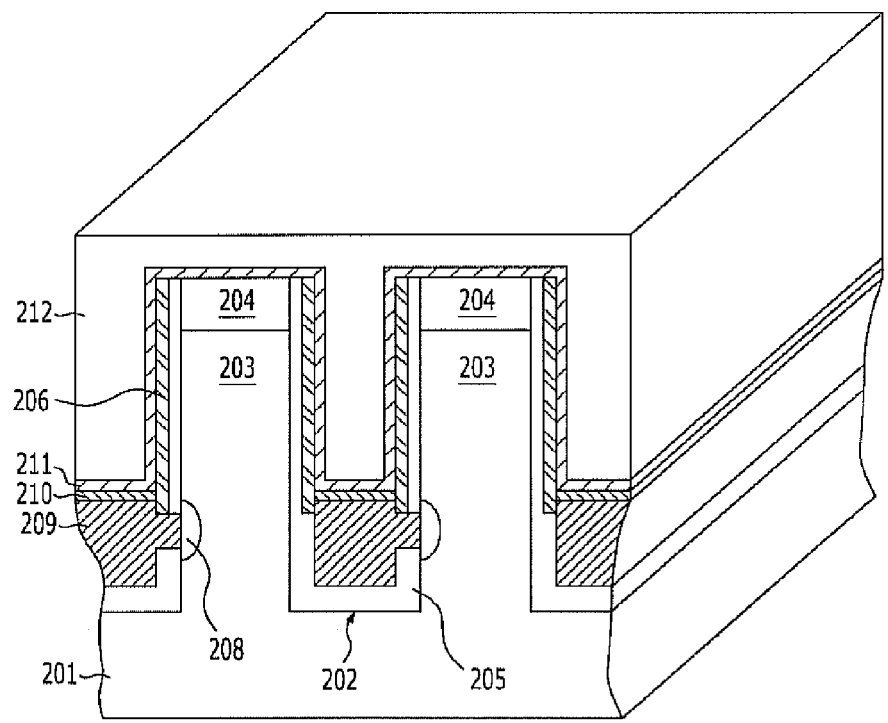

Referring to FIG. 1E, a bit line spacer 211 is formed over the substrate structure including the etch stop layer 210. The bit line spacer 211 includes a nitride layer such as a silicon nitride layer.

An inter-layer dielectric layer 212 is formed over the substrate structure including the bit line spacer 211. The inter-layer dielectric layer 212 includes an oxide layer such as a silicon oxide layer. The inter-layer dielectric layer 212 may include, for example, a spin on dielectric (SOD) layer or a high-density plasma oxide (HDP) layer. Also, the spin on dielectric layer may be formed for gap-filling and then the high-density plasma oxide layer may be formed.

The inter-layer dielectric layer 212 gap-fills the space between the bodies 203 over the bit line spacer 211.

Figure 1F:
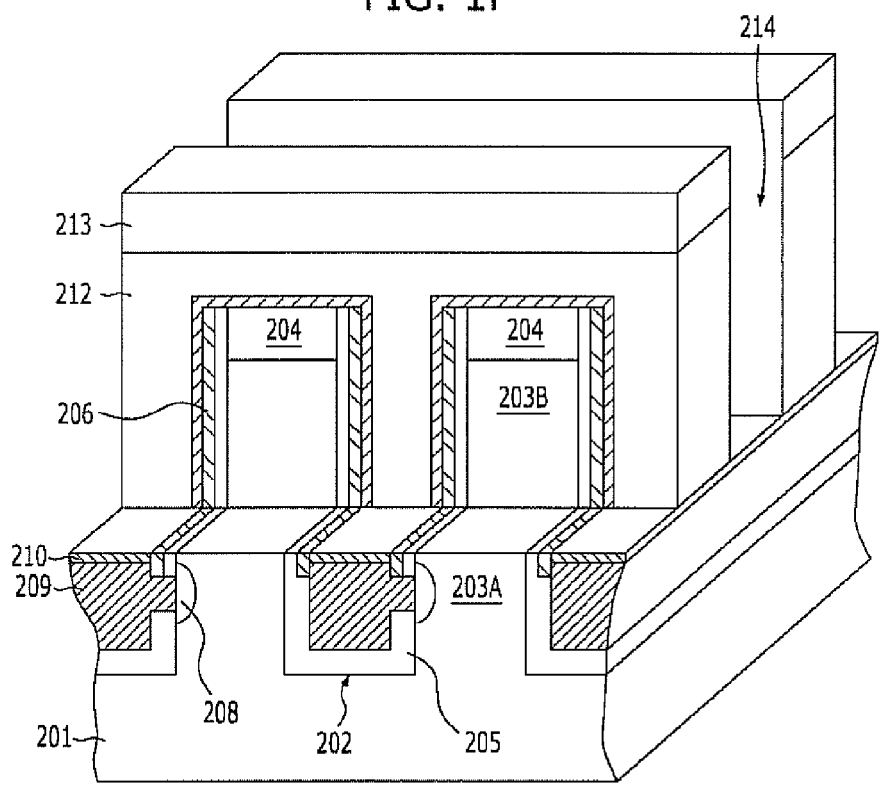

Referring to FIG. 1F, a word line trench mask 213 is formed over the inter-layer dielectric layer 212. The word line trench mask 213 is formed using a photoresist layer. The word line trench mask 213 is patterned in a direction crossing the buried bit line 209.

Subsequently, the inter-layer dielectric layer 212 is etched using the word line trench mask 213 as an etch barrier. Herein, the hard mask layer 204 and the body 203 are etched simultaneously. As a result, an active body 203A and active pillars 203B are formed. The active body 203A is formed over the substrate 201 and a plurality of active pillars 203B are formed over one active body 203A. The active body 203A is a portion where a junction 208 is formed. The active body 203A has a line shape extended in the same direction as the buried bit line 209. The active pillars 203B are pillars extended over the active body 203A in a vertical direction from the active body 203A. The plurality of the active pillars 203B formed over one active body 203A are isolated by a word line trench 214. The word line trench 214 is formed in a direction crossing the buried bit line 209. The process of forming the word line trench 214, the active body 203A, and the active pillars 203B is referred to as a vertical gate (VG) etch process.

In the embodiment of the present invention, it does not have to consider the remaining thickness when the inter-layer dielectric layer 212 is etched. In other words, the inter-layer dielectric layer 212 is etched until the etch process stops in the etch stop layer 210. Although the bit line spacer 211 is etched during the etching of the inter-layer dielectric layer 212, the etch process stops in the etch stop layer 210 so as to prevent the buried bit line 209 from being damaged. Since the tungsten oxide layer used as the etch stop layer 210 has excellent etch selectivity during the etching of a silicon oxide layer, a silicon nitride layer, and a silicon layer, it sufficiently functions as an etch barrier. For example, the vertical gate etch process can use a mixed gas of hydrogen bromide (HBr) and oxygen (O$_2$) to etch the plurality of bodies 203, and use a mixed gas of tetrafluoromethane (CF$_4$) and helium (He) to etch the inter-layer dielectric layer 212. The tungsten oxide layer used as the etch stop layer 210 has a certain selectivity with respect to the mixed gas of tetrafluoromethane (CF$_4$) and helium (He). Therefore, in the process of performing the vertical gate etch process, the timing when the etch stop layer 210 over the buried bit line 209 is exposed is detected to indicate an etch termination so that the etch process may be stopped.

Figure 1G:
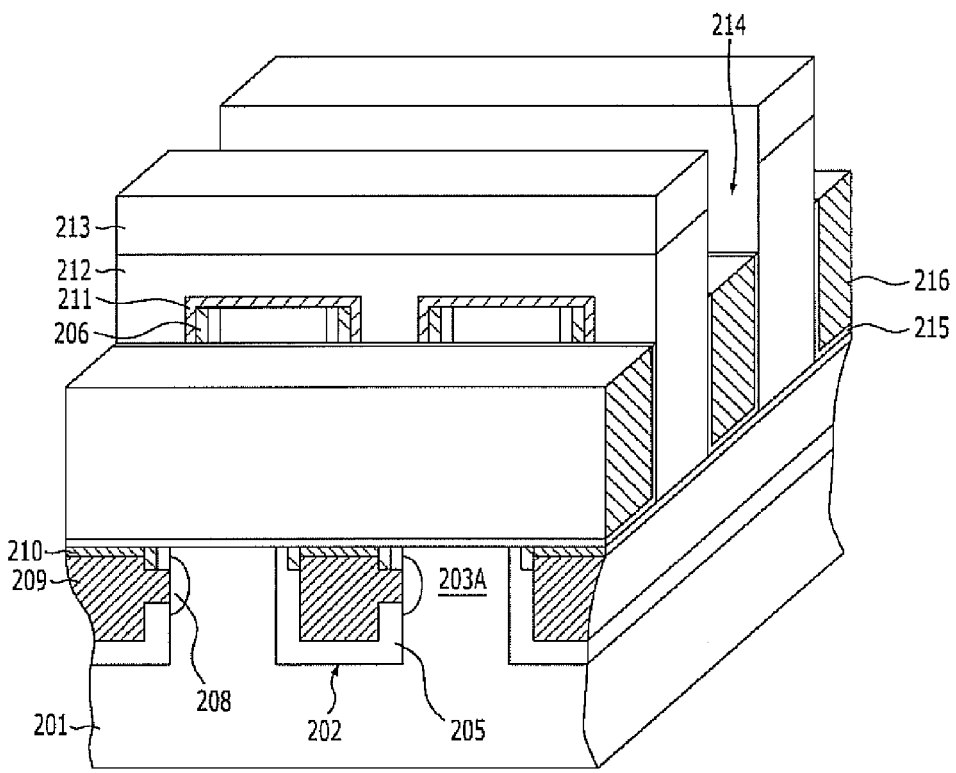

Referring to FIG. 1G, a word line conductive layer 216 is formed to gap-fill the word line trench 214. Subsequently, a planarization process and an etch-back process is performed to form the word line conductive layer 216 having a height of gap-filling a portion of the word line trench 214. A gate insulation layer 215 can be formed before the word line conductive layer 216 is formed. A portion of the gate insulation layer 215 may be removed during the planarization process and the etch-back process.

Figure 1H:
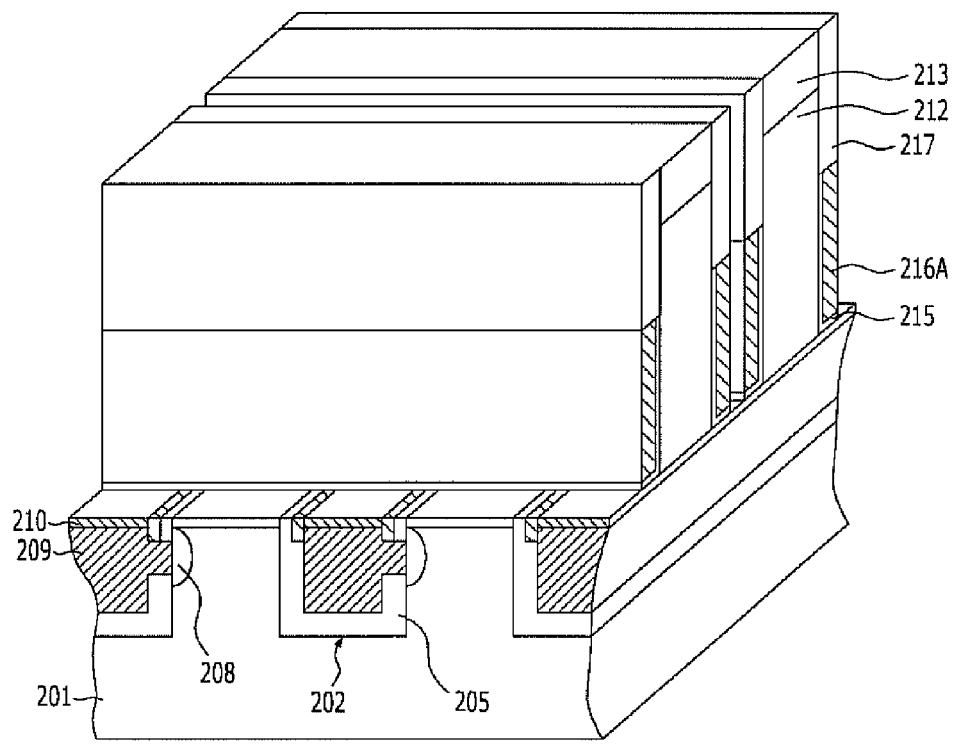

Referring to FIG. 1H, an etch-back process is performed after the deposition of, for example, a nitride layer so as to form a spacer 217. The word line conductive layer 216 is etched using the spacer 217 as an etch barrier. As a result, a word line 216A contacting a sidewall of each active pillar 203B is formed. The word line 216A is formed in a vertical direction from a sidewall of the active pillar 203B. The word line 216A serves as a vertical gate. According to another embodiment, after a vertical gate of a surround type surrounding each active pillar 203B is formed, the word line 216A coupling adjacent vertical gates with each other may be formed. The word line 216A is formed in a direction crossing the buried bit line 209. In an etch process for forming the word line 216A, the etch process stops in the etch stop layer 210 to protect the buried bit line 209 from being damaged.

According to the embodiment described above, the etch-back process, which is referred to as a buried bit line (BBL) etch process, is performed to form the buried bit line 209. Also, the vertical gate etch process is performed to form the active pillars 203B. The BBL etch process and the vertical gate etch process are processes that do not have an etch stop point in terms of the process, and therefore, the etch stop point may be widely varied. Therefore, in order to prevent an undesirable contact between the buried bit line 209 and the word line 216A, the spacing distance may be controlled in consideration of the process variation of the two processes.

According to the embodiment of the present invention, a surface treatment is performed including, for example, a plasma oxidation process to protect the buried bit line 209 from being damaged during the vertical gate etch process. As a result, the process margins of the vertical gate etch process may increase.

Moreover, the etch stop layer 210 uniformly maintains the distance between the buried bit line 209 and the word line 216A. Therefore, although there is some variation during the etch-back process for forming the buried bit line 209, the vertical gate etch process covers the etch-back process along the variation. As a result, the distance between the buried bit line 209 and the word line 216A may be greatly reduced. After all, the isolation region between junctions 208 is reduced.

FIGS. 2A to 2K are cross-sectional views illustrating a method for forming a side contact in accordance with an embodiment of the present invention.

Figure 2A:
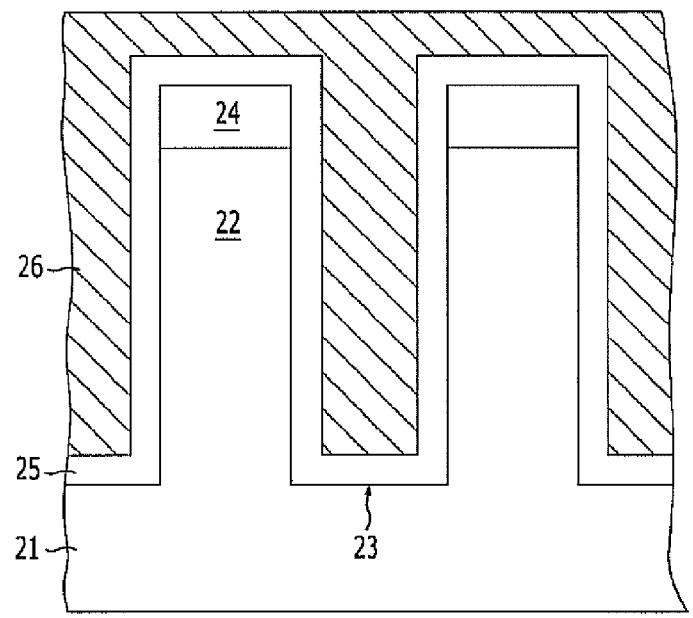
FIGS. 2A to 2K are cross-sectional views illustrating a method for forming a side contact in accordance with an exemplary embodiment of the present invention.

Referring to FIG. 2A, a plurality of bodies 22 are formed by using a hard mask pattern 24 as an etch barrier and etching a substrate 21. The bodies 22 are isolated by a plurality of trenches 23. Subsequently, a liner oxide layer 25 is formed as an insulation layer over the substrate structure including the bodies 22. The liner oxide layer 25 may be an oxide layer such as a silicon oxide layer.

A first gap-fill layer 26 for gap-filling the trenches 23 is formed over the liner oxide layer 25. The first gap-fill layer 26 may be of, for example, an undoped polysilicon layer or an amorphous silicon layer.

Figure 2B:
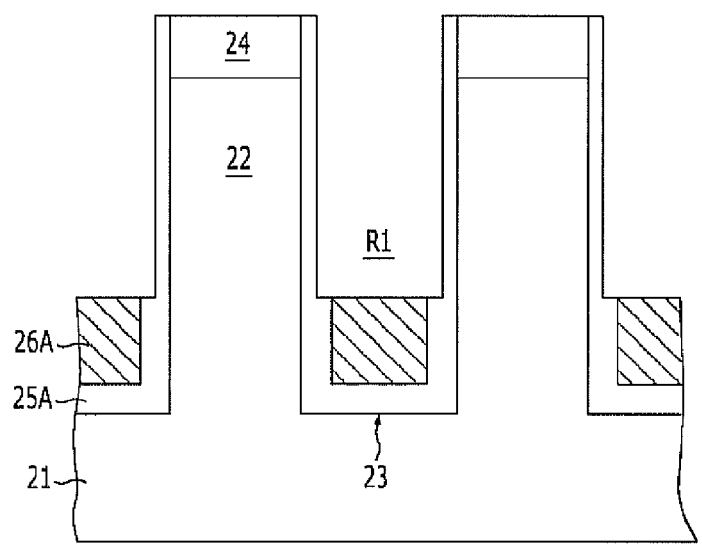

Referring to FIG. 2B, the first gap-fill layer 26 is planarized until the surface of the hard mask pattern 24 is exposed. The planarization of the first gap-fill layer 26 may be performed through a Chemical Mechanical Polishing (CMP) process. Subsequently, an etch-back process is performed. After the etch-back process, the first gap-fill layer 26 provides a first recess R1. During the CMP process, the liner oxide layer 25 over the hard mask pattern 24 may be polished. As a result, a liner oxide layer pattern 25A covering the hard mask pattern 24 and both sidewalls of each trench 23 remains. The liner oxide layer pattern 25A covers the bottom of the trench 23 as well.

Subsequently, a wet etch process is performed to decrease the thickness of the liner oxide layer pattern 25A.

Figure 2C:
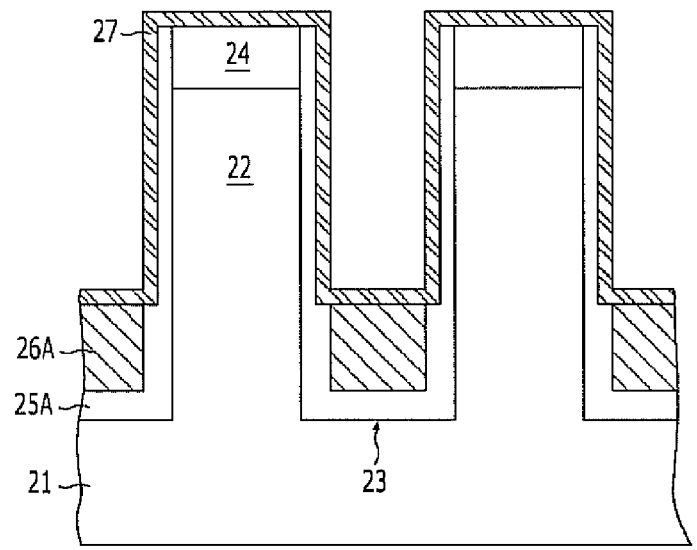

Referring to FIG. 2C, a liner nitride layer 27 is formed as an insulation layer over the substrate structure including a first gap-fill layer pattern 26A. The liner nitride layer 27 may be a nitride layer such as a silicon nitride layer.

Figure 2D:
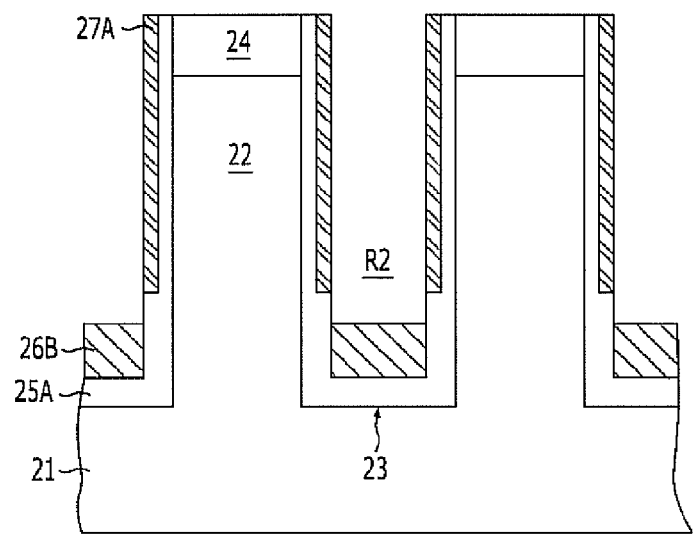

Referring to FIG. 2D, the liner nitride layer 27 is etched to form a liner nitride layer pattern 27A. Subsequently, the first gap-fill layer pattern 26A is recessed in a predetermined depth by using the liner nitride layer pattern 27A as an etch barrier. As a result, a second recess R2 is formed. The first gap-fill layer pattern with the second recess R2 is referred to as a recessed first gap-fill layer pattern 26B hereinafter.

Figure 2E:
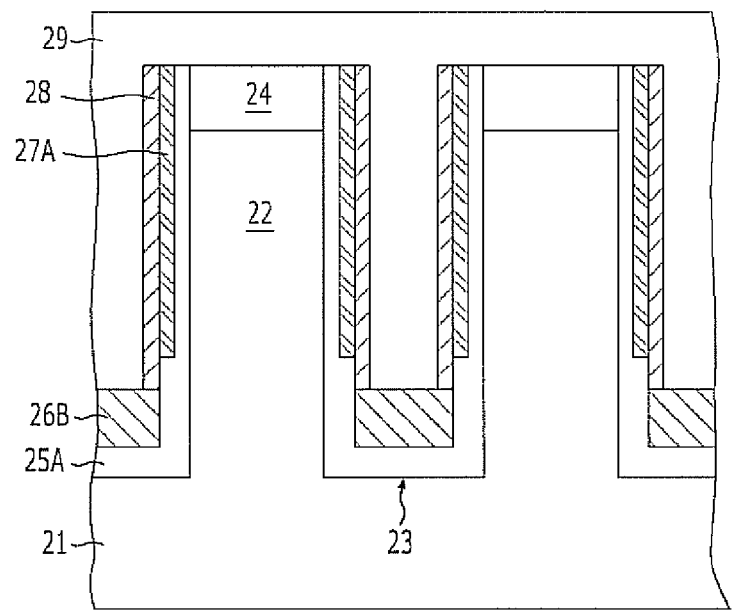

Referring to FIG. 2E, a metal nitride layer is conformally formed over the substrate structure including the second recess R2. Subsequently, a spacer etch process is performed to form a spacer 28. The spacer 28 is formed on both sidewalls of each body 22, i.e., on both sidewalls of the second recess R2. The spacer 28 may be formed of, for example, titanium nitride (TiN).

A second gap-fill layer 29 for gap-filling the second recess R2 with the spacer 28 formed therein is formed. The second gap-fill layer 29 may be an oxide layer. The second gap-fill layer 29 includes, for example, a spin on dielectric (SOD) layer.

Figure 2F:
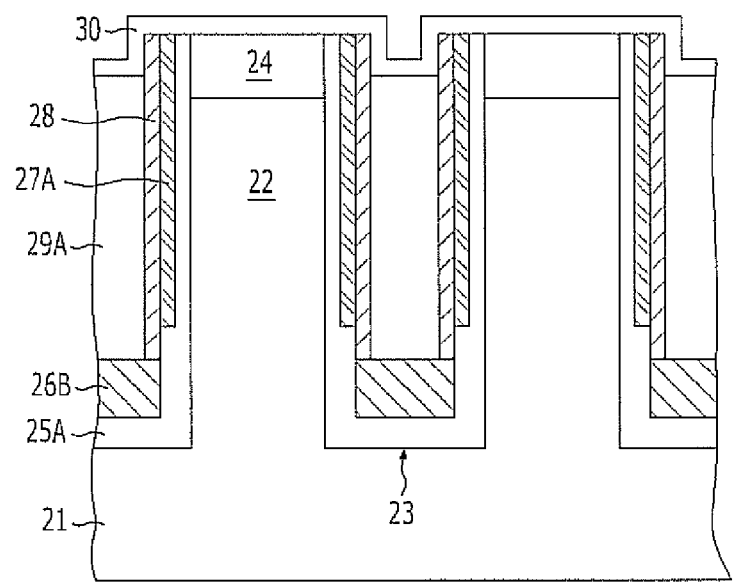

Referring to FIG. 2F, the second gap-fill layer 29 is planarized and then etched back. As a result, a recessed second gap-fill layer pattern 29A is formed.

Subsequently, an etch barrier layer 30 is formed over the substrate structure including the recessed second gap-fill layer pattern 29A. The etch barrier layer 30 may be, for example, an undoped polysilicon layer.

Figure 2G:
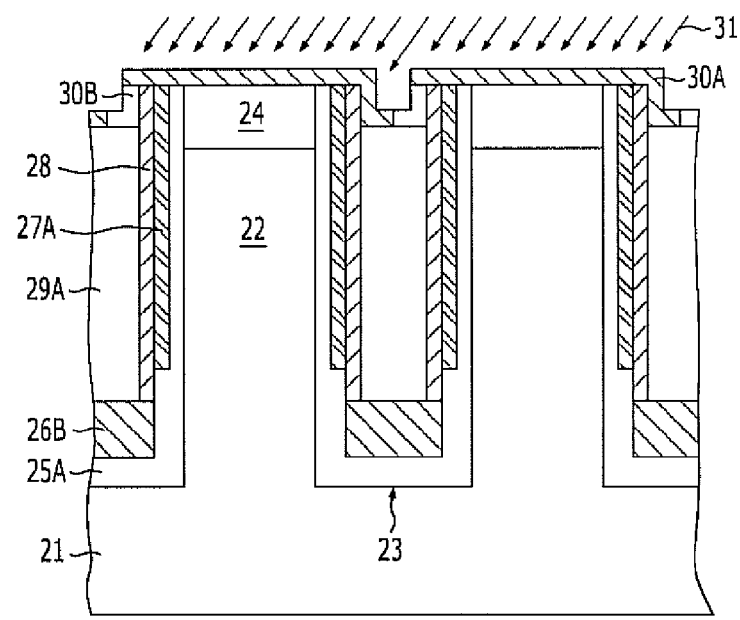

Referring to FIG. 2G, a tilt ion implantation process 31 is performed.

The tilt ion implantation process 31 is a process of ion-implanting a dopant at a tilt of a predetermined angle. As a result of the tilt ion implantation process 31, the dopant is implanted to a portion of the etch barrier layer 30.

The tilt ion implantation process 31 is performed at a desired angle, which ranges from approximately 5° to approximately 30°. Since a portion of Ion beam is shadowed by the hard mask pattern 24, a portion of the etch barrier layer 30 is doped but the other portion remains undoped. For example, the ion-implanted dopant is a P-type dopant, e.g., boron (B), and a dopant source for ion-implanting the boron is $BF_2$. As a result, a portion of the etch barrier layer 30 remains undoped, and the portion is a region adjacent to the left part of the hard mask pattern 24.

Through the tilt ion implantation process 31 of the dopant, a portion of the etch barrier layer 30 over the upper surface of the hard mask pattern 24 and a portion adjacent to the right part of the hard mask pattern 24 become a doped etch barrier layer 30A which is doped with the dopant. The etch barrier layer 30 into which the dopant is not implanted becomes an undoped etch barrier layer 30B.

Figure 2H:
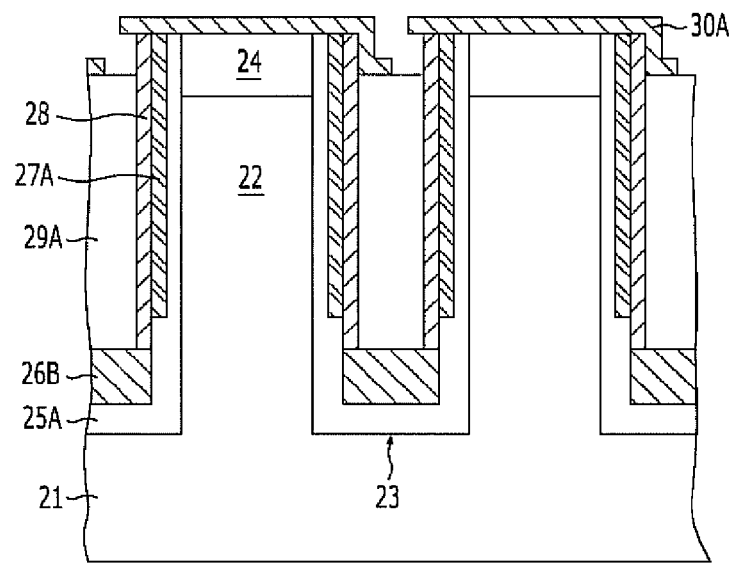

Referring to FIG. 2H, the undoped etch barrier layer 30B is removed. Herein, the polysilicon layer used as the etch barrier layer 30 has a difference in etch rate according to whether it is doped with the dopant or not. Particularly, the undoped polysilicon which is not doped with the dopant is rapidly wet-etched. Therefore, the undoped polysilicon is selectively removed by using a chemical having a high selectivity, which is capable of quickly wet-etching the undoped polysilicon only. The undoped etch barrier layer 30B is removed through a wet-etch process or a wet-cleaning process.

When the undoped etch barrier layer 30B is removed in the method described above, only the doped etch barrier layer 30A remains.

Figure 2I:
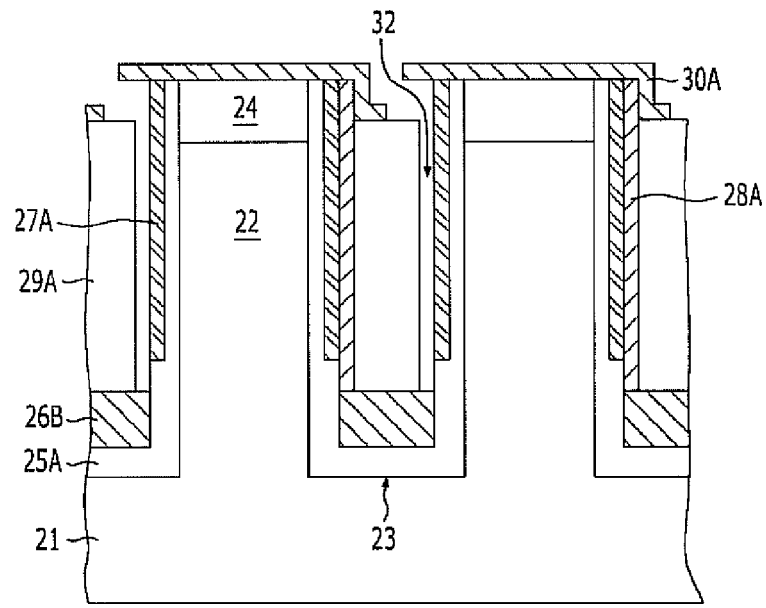

Referring to FIG. 2I, any one of the spacer 28 is removed. As a result, a gap 32 is formed. The spacer 28 is removed through a wet etch process. As a result, one spacer 28A remains.

Figure 2J:
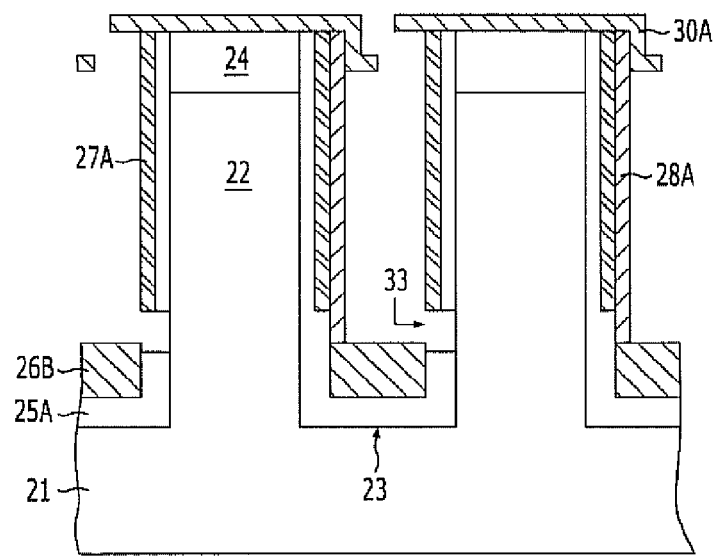

Referring to FIG. 2J, a cleaning process is performed to expose a portion of any one sidewall of the body 22.

The cleaning process includes a wet cleaning process. The wet cleaning process uses hydrogen fluoride (HF) and buffered oxide etchant (BOE). With the wet cleaning process, a portion of the liner oxide layer pattern 25A is removed to form a side contact 33. When the side contact 33 is formed, the recessed second gap-fill layer pattern 29A is removed as well.

As described above, the hard mask pattern 24, the liner oxide layer pattern 25A, and the liner nitride layer pattern 27A are simply referred to as an insulation layer collectively. Therefore, the insulation layer provides the side contact 33 which exposes a portion of any one sidewall of each body 22.

Figure 2K:
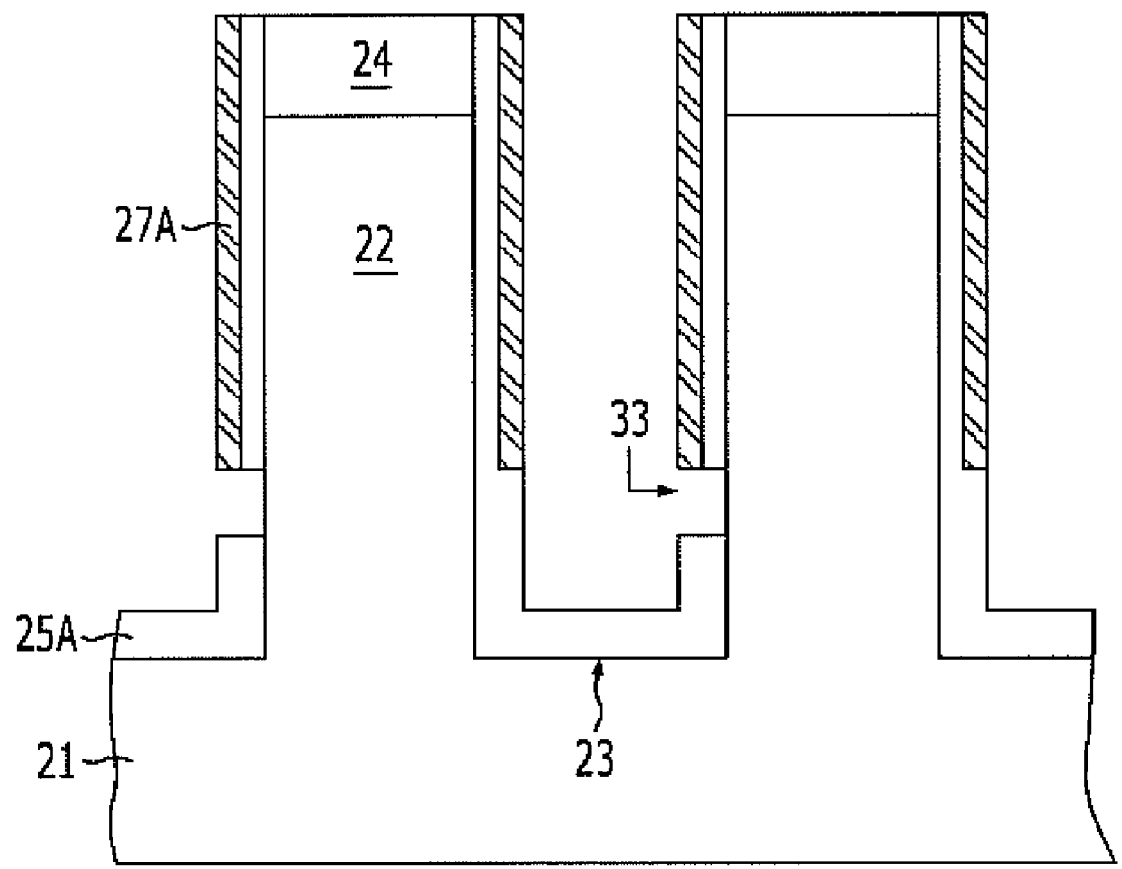

Referring to FIG. 2K, the spacer 28A and the doped etch barrier layer 30A are removed. When the doped etch barrier layer 30A is removed, the recessed first gap-fill layer pattern 26B is removed simultaneously.

According to an exemplary embodiment of the present invention, as the buried bit lines are formed of a metal layer including tungsten to decrease resistance, a semiconductor device may be implemented to alleviate deterioration in device characteristics despite the decreasing sizes of semiconductor devices.

Also, with an etch stop layer formed on the upper surface of the buried bit lines, the buried bit lines may be protected from being damaged during a subsequent process. Also, the etch stop layer preserves a desired distance between the buried bit lines and word lines while decreasing the distance between the buried bit lines and word lines.

Since the distance between the buried bit lines and word lines may be decreased, the isolation region between a channel and a junction, where no dopant exists, may be reduced in size, and resulting uniformity enables obtaining of appropriate characteristics of vertical channel transistors.

According to an exemplary embodiment of the present invention, a semiconductor device fabrication process may stably form vertical channel transistors in $4F^2$ cells to enable sub-50 nm-class DRAM fabrication processes.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a plurality of bodies isolated by trenches by etching a substrate;
    forming a buried bit line gap-filling a portion of each trench;
    forming an etch stop layer on an upper surface of the buried bit line; and
    forming a word line extended in a direction crossing the buried bit line over the etch stop layer.

2. The method of claim 1, wherein the forming of the etch stop layer comprises oxidizing the upper surface of the buried bit line.

3. The method of claim 1, wherein the etch stop layer is formed by using a plasma oxidation process.

4. The method of claim 1, wherein the buried bit line includes a metal layer.

5. The method of claim 4, wherein the etch stop layer includes a metal oxide layer.

6. The method of claim 1, wherein the buried bit line includes tungsten and the etch stop layer includes a tungsten oxide.

7. The method of claim 1, wherein the etch stop layer is formed in a thickness ranging from approximately 100 Å to approximately 200 Å.

8. The method of claim 1, further comprising:
    forming a side contact that exposes a portion of any one sidewall of each body before the forming of the buried bit line; and
    forming a junction on the portion of the sidewall of each body that is exposed by the side contact.

9. The method of claim 8, wherein the forming of the side contact comprises:
    forming an insulation layer covering the body; and
    forming the side contact which is opened in a line shape along a direction that the body is extended by removing a portion of the insulation layer.

10. The method of claim 8, wherein the junction is formed through a tilt ion implantation process, a plasma doping process, or a thermal diffusion process using a doped layer.

11. The method of claim 1, wherein the forming of the word line includes forming a word line trench by etching a dielectric layer and the etch stop layer is arranged to protect the buried bit-line from being etched during the etching of the dielectric layer.

12. The method of claim 1, wherein after the forming of the word line, the etch stop layer remains between the word line and the buried bit-line to separate the word line from the buried bit-line.

13. A method for fabricating a semiconductor device, comprising:
    forming a plurality of bodies isolated by trenches by etching a substrate;
    forming a buried bit line gap-filling a portion of each trench;
    forming an etch stop layer over the buried bit line;
    forming an inter-layer dielectric layer gap-filling the trench over the etch stop layer;
    forming a word line trench by etching the inter-layer dielectric layer over the etch stop layer and the bodies in a direction crossing the buried bit line; and
    forming a word line extended in a direction crossing the buried bit line on a sidewall of the word line trench.

14. The method of claim 13, wherein the forming of the etch stop layer comprises oxidizing an upper surface of the buried bit line.

15. The method of claim 13, wherein the etch stop Layer is formed through a plasma oxidation process.

16. The method of claim 13, wherein the inter-layer dielectric layer includes a silicon oxide layer.

17. The method of claim 13, wherein the buried bit line includes tungsten and the etch stop layer includes a tungsten oxide.

18. The method of claim 13, wherein the forming of the word line comprises:
    forming a conductive layer filling the word line trench;
    performing an etch-back process onto the conductive layer;
    forming a spacer covering a sidewall of the word line trench over the conductive layer which is etched back; and etching the conductive layer by using the spacer as an etch barrier.

19. The method of claim 13, further comprising:
forming a side contact which exposes a portion of any one sidewall of each body before the forming of the buried bit line; and
forming a junction on the portion of the sidewall of the body that is exposed by the side contact.

20. The method of claim 19, wherein the forming of the side contact comprises:
forming an insulation layer covering the body; and
forming the side contact which is opened in a line shape in a direction that the body is extended by removing a portion of the insulation layer.

* * * * *